United States Patent
Appelt et al.

(10) Patent No.: US 8,399,776 B2
(45) Date of Patent: Mar. 19, 2013

(54) SUBSTRATE HAVING SINGLE PATTERNED METAL LAYER, AND PACKAGE APPLIED WITH THE SUBSTRATE, AND METHODS OF MANUFACTURING OF THE SUBSTRATE AND PACKAGE

(75) Inventors: Bernd Karl Appelt, Gulf Breeze, FL (US); William T Chen, Endicott, NY (US); Calvin Cheung, San Jose, CA (US); Shih-Fu Huang, Zhudong Township, Hsinchu County (TW); Yuan-Chang Su, Luzhu Township, Taoyuan County (TW); Chia-Cheng Chen, Zhongli (TW); Ta-Chun Lee, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 460 days.

(21) Appl. No.: 12/562,950

(22) Filed: Sep. 18, 2009

(65) Prior Publication Data
US 2010/0288541 A1   Nov. 18, 2010

Related U.S. Application Data

(60) Provisional application No. 61/177,652, filed on May 13, 2009.

(51) Int. Cl.
 *H05K 1/09* (2006.01)
(52) U.S. Cl. ........................................................ 174/257
(58) Field of Classification Search .................. 174/257, 174/255, 256, 258, 260, 262, 264; 361/306.1, 361/765
See application file for complete search history.

(56) References Cited

U.S. PATENT DOCUMENTS

| | | | |
|---|---|---|---|
| 5,583,376 A | 12/1996 | Sickler et al. |
| 5,592,025 A | 1/1997 | Clark et al. |
| 5,874,784 A | 2/1999 | Aoki et al. |
| 5,994,773 A | 11/1999 | Hirakawa |
| 6,060,775 A | 5/2000 | Ano et al. |
| 6,080,932 A | 6/2000 | Smith et al. |
| 6,087,717 A | 7/2000 | Ano et al. |
| 6,177,636 B1 | 1/2001 | Fjelstad |
| 6,198,165 B1 | 3/2001 | Yamaji et al. |
| 6,232,650 B1 | 5/2001 | Fujisawa et al. |
| 6,232,661 B1 | 5/2001 | Amagai et al. |
| 6,242,815 B1 | 6/2001 | Hsu et al. |
| 6,271,057 B1 | 8/2001 | Lee et al. |
| 6,331,451 B1 | 12/2001 | Fusaro et al. |

(Continued)

OTHER PUBLICATIONS

Appelt et al., "Coreless substrates status." Proc. EPTC 2010 (12th Electronics Packaging Tech. Conf, Singapore (2010).

(Continued)

*Primary Examiner* — Jeremy Norris
*Assistant Examiner* — Tremesha S Willis
(74) *Attorney, Agent, or Firm* — Foley & Lardner LLP

(57) ABSTRACT

A substrate having single patterned metal layer includes a patterned base having at least a plurality of apertures, the patterned metal layer disposed on the patterned base, and a first surface finish layer. Parts of the lower surface of the patterned metal layer are exposed by the apertures of the patterned base to form a plurality of first contact pads for downward electrical connection externally, and parts of the upper surface of the patterned metal layer function as a plurality of second contact pads for upward electrical connection externally. The first surface finish layer is disposed at least on one or more surfaces of the second contact pads, and the first surface finish layer is wider than the second contact pad beneath. A package applied with the substrate disclosed herein further comprises at least a die conductively connected to the second contact pads of the substrate.

40 Claims, 9 Drawing Sheets

U.S. PATENT DOCUMENTS

| | | | |
|---|---|---|---|
| 6,358,780 | B1 | 3/2002 | Smith et al. |
| 6,552,430 | B1 | 4/2003 | Perez et al. |
| 6,580,159 | B1 | 6/2003 | Fusaro et al. |
| 6,663,946 | B2 * | 12/2003 | Seri et al. .............. 428/209 |
| 6,774,317 | B2 | 8/2004 | Fjelstad |
| 6,861,757 | B2 | 3/2005 | Shimoto et al. |
| 6,977,348 | B2 | 12/2005 | Ho et al. |
| 7,338,884 | B2 | 3/2008 | Shimoto et al. |
| 7,405,486 | B2 | 7/2008 | Kato |
| 7,423,340 | B2 | 9/2008 | Huang et al. |
| 7,566,969 | B2 | 7/2009 | Shimanuki |
| 7,595,553 | B2 | 9/2009 | Nagamatsu et al. |
| 7,612,295 | B2 | 11/2009 | Takada et al. |
| 7,902,648 | B2 | 3/2011 | Lee et al. |
| 7,919,851 | B2 * | 4/2011 | Fan .............. 257/700 |
| 7,948,090 | B2 | 5/2011 | Manepalli et al. |
| 8,288,869 | B2 | 10/2012 | Huang et al. |
| 2002/0030266 | A1 | 3/2002 | Murata |
| 2002/0153618 | A1 | 10/2002 | Hirano et al. |
| 2002/0171145 | A1 | 11/2002 | Higuchi et al. |
| 2002/0173069 | A1 | 11/2002 | Shibata |
| 2002/0182776 | A1 | 12/2002 | Fujisawa et al. |
| 2002/0192872 | A1 | 12/2002 | Fujisawa et al. |
| 2003/0030137 | A1 | 2/2003 | Hashimoto |
| 2003/0034553 | A1 | 2/2003 | Ano |
| 2003/0098502 | A1 | 5/2003 | Sota |
| 2004/0080054 | A1 | 4/2004 | Chinda et al. |
| 2005/0186704 | A1 | 8/2005 | Yee et al. |
| 2007/0234563 | A1 | 10/2007 | Sakaguchi et al. |
| 2007/0272940 | A1 | 11/2007 | Lee et al. |
| 2008/0284017 | A1 | 11/2008 | Lee et al. |
| 2009/0115072 | A1 | 5/2009 | Rhyner et al. |
| 2009/0294160 | A1 * | 12/2009 | Yoshimura et al. ........... 174/257 |
| 2010/0289132 | A1 | 11/2010 | Huang et al. |
| 2010/0314744 | A1 | 12/2010 | Huang et al. |
| 2010/0320610 | A1 | 12/2010 | Huang et al. |
| 2011/0057301 | A1 | 3/2011 | Chen et al. |
| 2011/0074008 | A1 | 3/2011 | Hsieh |
| 2011/0084370 | A1 | 4/2011 | Su et al. |
| 2011/0084372 | A1 | 4/2011 | Su et al. |
| 2011/0169150 | A1 | 7/2011 | Su et al. |

OTHER PUBLICATIONS

Appelt, et al. "A new, cost effective coreless substrate technology." Proc. ICSJ, The IEEE CPMT Symposium Japan, Univ. Tokyo, Tokyo Japan (2010).

Appelt et al., "Single sided substrates and packages based on laminate materials." APM-Microtech, Cambridge UK (Mar. 2010).

Appelt et al., "Single sided substrates—a new opportunity for miniaturizing packages." ICEP (Int'l Conf. on Electronics Packaging), Hokkaido, Japan (May 2010).

Kikuchi, et al., "High-performance FCBGA based on ultra-thin packaging substrante," NEC J. Adv. Tech. vol. 2:3 pp. 222-228 (2005).

* cited by examiner

SUBSTRATE HAVING SINGLE PATTERNED METAL LAYER, AND PACKAGE APPLIED WITH THE SUBSTRATE, AND METHODS OF MANUFACTURING OF THE SUBSTRATE AND PACKAGE

This application claims the benefit of U.S. Provisional Application No. 61/177,652, filed May 13, 2009, the subject matter of which is incorporated herein by reference.

BACKGROUND OF THE INVENTION

1. Field of the Invention

The invention relates in general to a substrate and a package and methods of manufacturing the same, and more particularly to the substrate having a single patterned metal layer, and a package applying the substrate, and methods of manufacturing the substrate and the package.

2. Description of the Related Art

The integrated circuit (IC) package technology plays an important role in the electronics industry. Electronic packaging is for protecting and supporting circuit configuration, creating a path for heat dissipation and providing modularized standard specification form factors for the parts. Electronic packaging in 1990s mainly employs ball grid array (BGA) packaging which is excellent in heat dissipation, has excellent electrical properties and is capable of increasing leads and effectively reducing the surface area of the package.

As lightweight, thinness, compactness, and high efficiency have become universal requirements of consumer electronic and communication products, the chip requires superior electrical properties, a smaller overall volume, and a larger number of I/O ports. As the number of I/O ports increases, the pitch of the integrated circuit is reduced. Thus, it is very difficult to achieve a high efficiency wiring on a BGA substrate or a lead frame substrate. For example, the density of I/O ports increases dramatically starting with the 0.18 μm IC node or high speed (such as 800 MHz above) IC design. Flip chip technology, having high I/O density and excellent electrical properties, is a solution to the above problem and has become one of the mainstreams in the development of electronic carriers. It is a main goal for the manufacturers to develop a substrate with higher density of I/O ports, smaller trace pitches and excellent electrical properties. Besides, in addition to the request of the flip chip technology, the request of systematic integration of the downstream products is also getting more and more urgent. Thus, the multi-chip module (MCM) process has an increased need of the MCM carrier. The MCM carrier and the flip chip carrier have great market potentia.

Along with the maturity in the chip scale packaging (CSP) technology, system in package SiP, the systematic semiconductor integration on a package level, which function-wise and cost-wise, has become a mainstream in packaging technology. As the product size becomes smaller and smaller and the function becomes more and more versatile, the SiP technology is used to satisfy the market demands. SiP technology integrates chips of different functions, passive components and other modules together, so that the electronic products have versatile functions. SiP technology also includes different technologies such as 2-dimensional multi-chip module packages and 3-dimensional stacked packages which stack chips of different functions for saving space. As for what type of packaging is most suitable for an application is determined according to the needs of the application. The SiP technology has a wide range of definition, and employs many types of bonding technologies such as wire bonding, flip chip bonding and hybrid-type bonding.

Take the SiP package for example. The SiP package integrates the dice of different digital or analogue functions and bonds the dice on a chip carrier by way of bump bonding or wire bonding. The carrier having embedded passive components or traces possesses electrical properties and is called the integrated substrate or the functional substrate. FIG. 1A~FIG. 1F schematically shows a progressive flow of manufacturing of a conventional integrated substrate. First, a copper clad laminate (CCL) having a core 102 sandwiched between the first conductive layer 103 and a second conductive layer 104 is provided, as shown in FIG. 1A. The first conductive layer 103 and the second conductive layer 104 are formed of copper. The copper clad laminate is then drilled to form the through hole 106, as shown in FIG. 1B. Next, copper plating step is performed to plate the copper layer 107 on the surfaces of the first and second conductive layers 103 and 104, and also at the sidewall of the through hole 106', as shown in FIG. 1C. Afterward, the metal trace formation proceeds. As shown in FIG. 1D, a patterned dry film 108 is formed on each copper layer 107. Next, the copper layer (107+103 and 107+104 respectively) is etched according to the patterned dry film 108 (as a mask), as shown in FIG. 1E. Finally, the patterned dry film 108 is removed, and the metal trace (107+103) is revealed. Also, the subsequent steps could be further conducted to complete the final product. For example, a solder mask (SM) is printed followed by exposing and developing procedures to expose partial surface of the metal trace (107+103), and a surface treatment such as Ni/Au is plated on the exposed surface of the metal trace (107+103).

For another type of integrated substrate, the through hole in the substrate could be filled with the conductive material such as copper by plating procedure, and the copper layers on two sides of the core are then patterned to form the metal trace. FIG. 2 schematically shows an alternative structure of conventional integrated substrate. However, plating procedure for filling the through hole requires more complicated technique and longer time to plate. Also, it is difficult to control the thickness of the copper layers 115, 116 and 117 (especially copper layer 117).

Since the substrate depicted in FIG. 1F or FIG. 2 mainly include a core layer (102/112) sandwiched between "two conductive layers", it is so called a 2-L substrate.

To satisfy the requirements of small-sized electronic products, it is a trend to develop a substrate structure with high density of I/O ports and small trace pitches without sacrificing the electrical properties. However, it is difficult to further reduce the size of the conventional structures (such as substrates of FIG. 1F and FIG. 2) using the known manufacturing methods. Besides the size and electrical properties, manufacturing cost of the substrate is also a considerable factor in the device application, especially for the small device with lower market price. Thus, it is an important goal for the manufacturers to develop a novel substrate with low (thin) profile, and manufactured by a simplified process, suitable for mass production and maintaining high production yield, so as to satisfy the desired requirements of the electronic product with low profile and low cost.

SUMMARY OF THE INVENTION

The present invention provides structures of the substrate having a single patterned metal layer, and the package with this substrate, and methods of manufacturing the same. The substrate of the disclosure merely includes a patterned metal layer (as conductive traces) and a patterned base, which reduces the thickness of the substrate. This extra thin substrate is particularly suitable for the application of small-sized, low profile products. Also, the simplified process for manufacturing the substrate is suitable for mass production, while high production yield is still maintained. Compared to the prior art, the substrate structure of the disclosure satisfies the desired requirements of the electronic product with thin profile and low cost.

According to the first aspect of the invention, a substrate having a single patterned metal layer is provided, including a patterned base having at least a plurality of apertures, the patterned metal layer disposed on the patterned base, and a first surface finish layer. The patterned metal layer has an upper surface and a lower surface. Parts of the lower surface of the patterned metal layer are exposed by the apertures of the patterned base to form a plurality of first contact pads for downward electrical connection externally, and parts of the upper surface of the patterned metal layer function as a plurality of second contact pads for upward electrical connection externally. The first surface finish layer is disposed at least on one or more surfaces of the second contact pads, and the first surface finish layer is wider than the second contact pad beneath.

According to the second aspect of the invention, a package with the substrate having a single patterned metal layer is provided, comprising the substrate described in the first aspect, at least a die conductively connected to the second contact pads of the substrate, and a molding compound disposed on the patterned base so as to cover the patterned metal layer, the patterned base and the die.

According to the third aspect of the invention, a method of manufacturing a substrate having single patterned metal layer is disclosed. First, a patterned base having at least a plurality of apertures is provided. Then, a patterned metal layer is formed on the patterned base, and the patterned metal layer having an upper surface and a lower surface, wherein parts of the lower surface of the patterned metal layer are exposed by the apertures of the patterned base to form a plurality of first contact pads for externally conductive connection, and parts of the upper surface of the patterned metal layer function as a plurality of second contact pads for conductive connection upwardly. A surface finish layer is formed on the first contact pads. Next, a first surface finish layer is formed on one or more surfaces of the second contact pads, wherein the first surface finish layer is wider than the second contact pad beneath. The surface finishes may be the same in the case of a universal surface finish or different according to the needs of the type of interconnection.

Other objects, features, and advantages of the present invention will become apparent from the following detailed description of the preferred but non-limiting embodiment. The following description is made with reference to the accompanying drawings.

DETAILED DESCRIPTION OF THE INVENTION

In the present invention, a substrate having a single patterned metal layer, and a package applied with the substrate, and methods of manufacturing the substrate and package are disclosed. The substrate of the disclosure mainly includes a patterned base and a patterned metal layer, wherein parts of the lower surface of the patterned metal layer are exposed by the apertures of the patterned base to form a plurality of first contact pads (such as ball pads) for electrical connection downwardly, and parts of the upper surface of the patterned metal layer function as a plurality of second contact pads (such as die bonding pads) for electrical connection upwardly. In an embodiment, a first surface finish layer is disposed at least on one or more surfaces of the second contact pads, and the first surface finish layer is wider than the second contact pad beneath. In an alternative embodiment, a first surface finish layer is disposed at least on one or more surfaces of the second contact pads while a second surface finish layer is disposed at the first contact pads, wherein the first surface finish layer of the second contact pad is wider than the second contact pad beneath as well as the first contact pad and the second finish layer. Alternatively, the first surface finish layer could be disposed on one or more surfaces and sidewalls of the second contact pads, such as covering the second contact pads. Further, a surface finish may cover all metal surfaces if convenient for the manufacturing process.

Figure 1A:
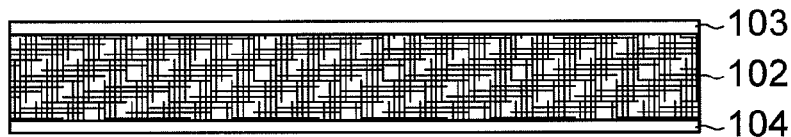
FIG. 1A~FIG. 1F schematically shows a progressive flow of manufacturing of a conventional integrated substrate.
Figure 1B:
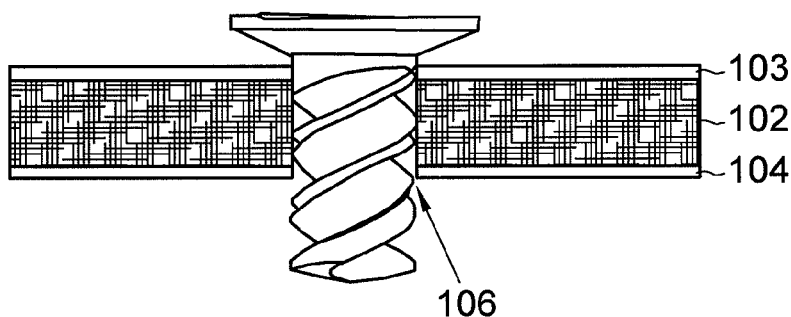
Figure 1C:
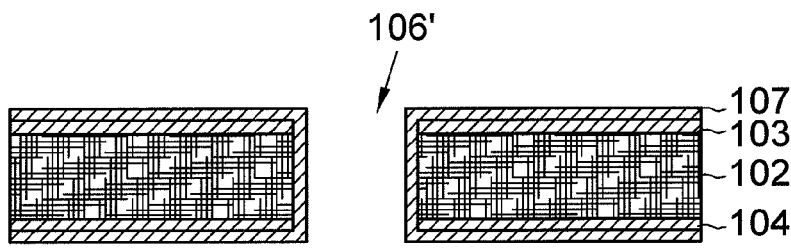
Figure 1D:
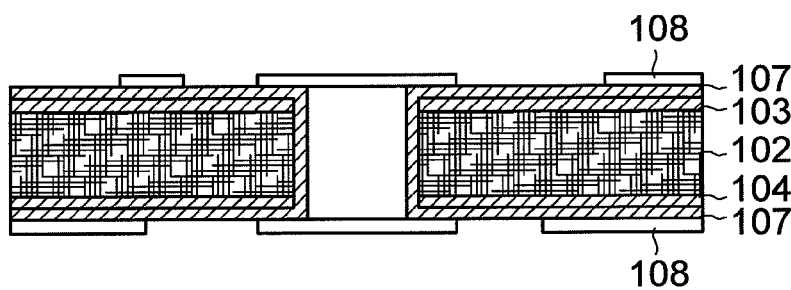
Figure 1E:
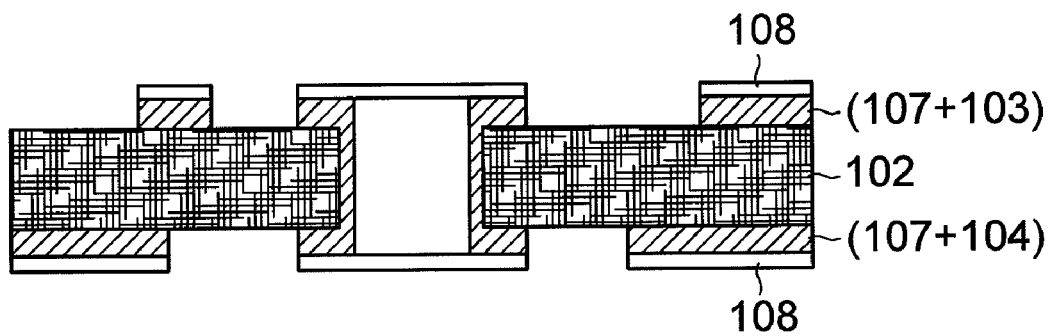
Figure 1F:
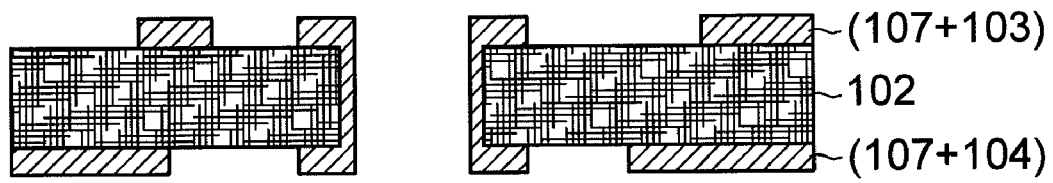
Figure 2:
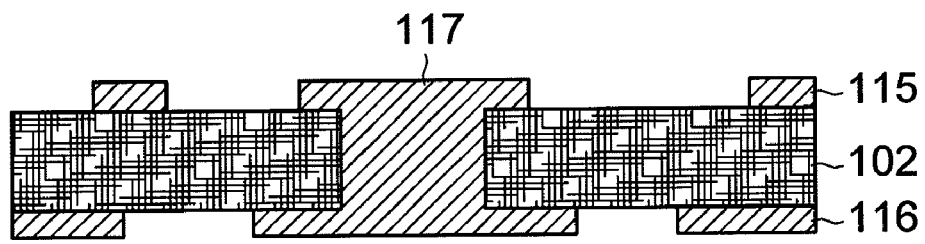
FIG. 2 schematically shows an alternative structure of conventional integrated substrate.

Compared to the prior art as depicted in FIG. 1F and FIG. 2, the thickness of the substrate is reduced giving rise to a lower profile package. This extra thin substrate is particularly suitable for the application of small-sized product. Also, the methods for manufacturing the substrates and packages disclosed herein proceed using a carrier, which is simple, easy to perform and suitable for mass production. The substrate manufactured by the method disclosed in the embodiments has advantages of high yield of production, thin profile and low cost, which satisfies the desired requirements of the electronic product in the applications. The electronic product applied with the substrate of the present invention, especially for the small-sized and low-priced product, is very competitive in the commercial market.

Several embodiments are provided to demonstrate the structures of substrate, and the package with the substrate, and methods of manufacturing the substrate and package. The methods of manufacturing the substrates would be slightly modified, without departing from the spirit of the invention, due to the different materials of the patterned base adopted in the embodiments. The first and second embodiments disclose manufacturing methods suitable for use of a copper clad laminate (CCL) with one layer of metal foil as the patterned base, and the third embodiment discloses manufacturing method suitable for use of a dielectric layer (ex: solder resist, bismaleimide triazine (BT), . . . , etc.) as the patterned base. However, the configurations of the substrates, material selections and the manufacturing processes described and illustrated in those embodiments are not intended to limit the invention. The modifications and variations can be made without departing from the spirit of the invention to meet the requirements of the practical applications.

Therefore, people skilled in the art would know that the structures and manufacturing methods presented in the embodiments and drawings could be slightly modified under the spirit of the invention. Also, it is also important to point out that the illustrations may not be necessarily be drawn to scale, and that there may be other embodiments of the present invention which are not specifically illustrated. Thus, the specification and the drawings are to be regard as an illustrative sense rather than a restrictive sense. Additionally, the drawings used for illustrating the embodiments and applications of the present invention only show the major characteristic parts in order to avoid obscuring the present invention.

First Embodiment

FIG. 3A~FIG. 3F schematically shows a progressive flow of manufacturing a substrate having single patterned metal layer according to the first embodiment of the present invention.

Figure 3A:
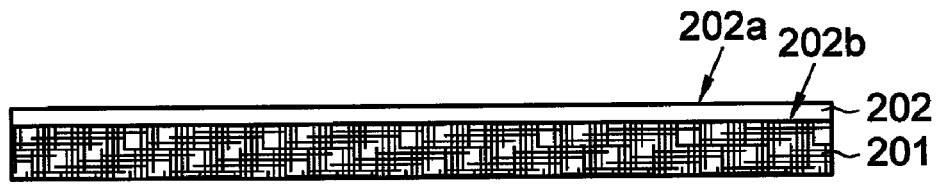
FIG. 3A~FIG. 3F schematically shows a progressive flow of manufacturing a substrate having a single patterned metal layer according to the first embodiment of the present invention.

First, a base 201 is provided, and a metal layer 202 is formed on the base 201, as shown in FIG. 3A. The metal layer 202 includes an upper surface 202a and a lower surface 202b.

The base 201 can be formed of a variety of materials, such as resin or dielectric materials. Examples of resin materials of the base 201 include Ajinomoto build-up film (ABF), bismaleimide triazine (BT), polyimide (PI), liquid crystal polymer (LCP), epoxy, resin with a single copper foil, prepreg (PP), and other resin materials. The resins may be reinforced with glass fibers which can be woven or fiber mat or filled with a particulate filler. Alternatively, the base 201 may be formed of solder mask (SM), liquid crystal polymer (LCP), prepreg (PP), or other dielectric materials. It is not intended that the material of base 201 be limited to these illustrative compounds. In the first embodiment, the base 201 formed of resin material is exemplified for describing the progressive flow of manufacturing the substrate.

In an alternative embodiment, a copper clad laminate (CCL), originally including a core (resin reinforced with glass fiber) sandwiched between two metal foils, can be used as the base 201 and the metal layer 202 after one metal foil of the CCL has been removed as shown in FIG. 3A.

Figure 3B:
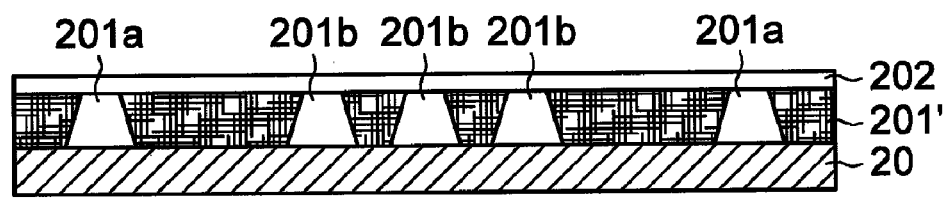

Next, the base 201 is patterned to form a patterned base 201' with a plurality of apertures 201a or through holes 201b, as shown in FIG. 3B. Typically, one or the other type of holes or apertures is used although the Figures show both for convenience. The patterning of the base 201 may be done by conventional stamping, chemical etching, or other computer-aided drilling methods (such as laser drilling or mechanical drilling). For example, the base 201 formed of bismaleimide triazine (BT) or the core of CCL can be patterned by laser drilling. Subsequently, the patterned base 201' is placed on a carrier 20. In particular embodiments, an exposed area of the bottom surface of the patterned base 201' by one of the apertures 201a is larger than an exposed area of an upper surface of the patterned base 201' by the aperture 201a, when the base 201 is patterned by laser drilling. However, the method for patterning the base 201 is not limited, and configurations of the apertures 201a/through holes 201b may vary from that illustrated in FIG. 3B, depending on the specific requirements in a practical application. Further, if only apertures 201a are formed, the base 201 and the metal layer 202 (metal foil) of FIG. 3A may be affixed to an inert carrier with the metal foil on the carrier to enable handling of these very thin bases and metal foils. With a suitable carrier this can be done on both sides to allow double sided processing for increased efficiency. After patterning of the base, the carrier is released, base with metal foil are inverted and reattached to the carrier. For simplicity, only single sided processing is depicted in the Figures.

Subsequently, steps of forming a patterned metal layer 202' and a surface finish proceeds. In the first embodiment, the first surface finish layers 204a and 204b are formed before patterning the metal layer 202. The metal layer 202 is patterned in accordance with the presence of the first surface finish layers 204a and 204b to form the patterned metal layer 202'.

Figure 3C:
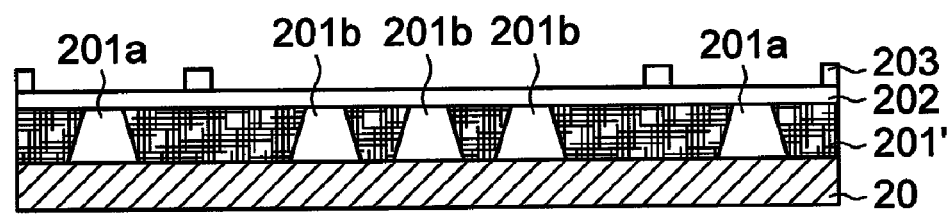
Figure 3D:
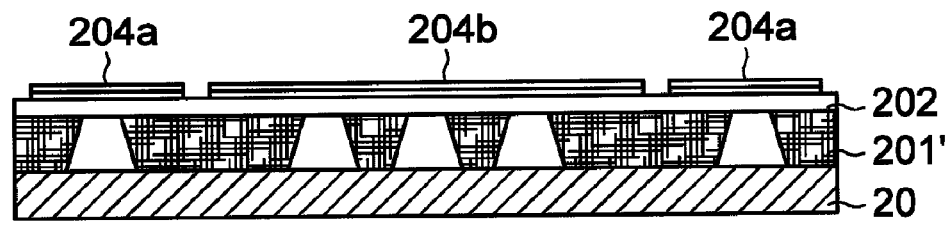

FIG. 3C shows a patterned dry film 203 is formed on the metal layer 202. A dry film (not shown) deposited on the metal layer 202 may be exposed to light and then developed to form the patterned dry film 203. Subsequently, the first surface finish layers 204a and 204b are formed on the metal layer 202 in the presence of the patterned dry film 203. Finally, the patterned dry film 203 is removed to reveal the structure of FIG. 3D.

Figure 3E:
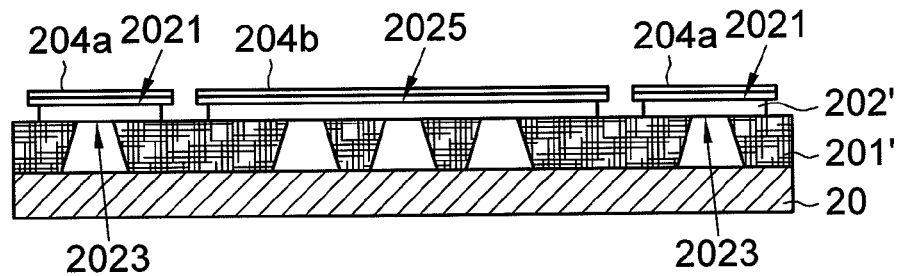

Afterwards, a dry film is applied over the metal layer 202 and the finish layers 204a and 204b, exposed, developed and is etched according to the patterned dry film to form a patterned metal layer 202', as shown in FIG. 3E after stripping the dry film. The patterned metal layer 202' ultimately will form the first contact pads 2023, the second contact pads 2021 and the die pad 2025, wherein the first and second contact pads 2023 and 2021 are positioned outside the die pad 2025. Also, the first and second contact pads 2023 and 2021 are in the same horizontal plane as die pad 2025.

Figure 3F:
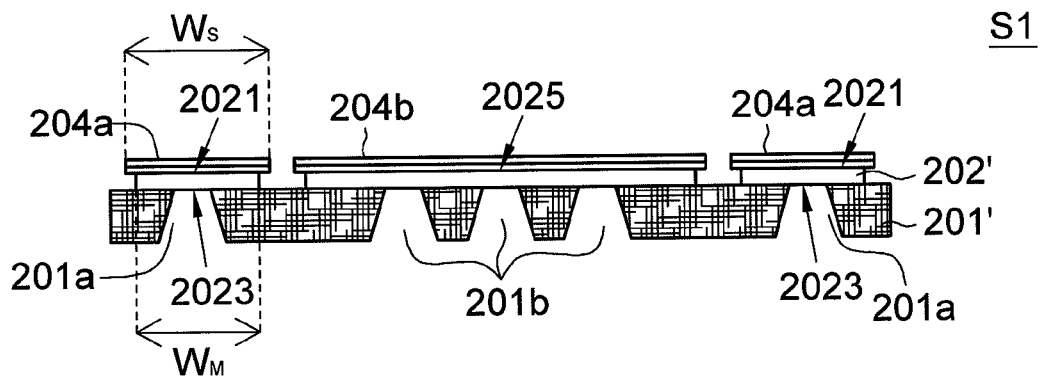

Finally, the carrier 20 is removed and subjected to a treatment with organic solderability preservatives (OSP) to protect the copper surfaces from oxidation. This completes the fabrication of the substrate S1, as shown in FIG. 3F without the anti-tarnish. Suitable OSPs are based on benzotriazoles, benzimidazoles, and their respective derivatives.

FIG. 3F is a cross-sectional view of a substrate according to the first embodiment of the present invention. In the substrate S1 of FIG. 3F, parts of the lower surface of the patterned metal layer 202' are exposed by the apertures 201a of the patterned base 201' to form the first contact pads 2023 for electrical connection externally. In particular applications, the first contact pads 2023 are ball pads for being attached by the solder balls (not shown) downwardly. In one embodiment, the patterned base 201' may include at least an open slot so as to expose the first contact pads 2023. Also, parts of the upper surface of the patterned metal layer 202' function as a plurality of second contact pads 2021 for electrical connection upwardly. In typical applications, the second contact pads 2021 are the bonding pads for conductive connection between the substrate S1 and a die/chip (not shown) of the package. As shown in FIG. 3F, the first surface finish layer 204a is formed on the surfaces of the second contact pads 2021, and the width $W_S$ of the first surface finish layer 204 is larger than the width $W_M$ of the second contact pad 2021 beneath as well as the first contact pad 2023. Also, the first surface finish layer 204b is formed on the surfaces of the die pad 2025, and the width of the first surface finish layer 204b is larger than the width of the die pad 2025 beneath. In addition, the die pad 2025 as illustrated in FIG. 3F is a continuous metal body while the portion of the patterned base 201' juxtaposed with the die pad 2025 is a patterned base body (i.e. the lower surface of die pad 2025 being exposed by the through holes 201b of the patterned base 201'), which enhances thermal performance of the applied package.

Although FIG. 3F depicts the die pad 2025 of substrate S1 as a continuous metal body on the patterned base 201', it is not intended that the invention be limited to this illustrative embodiment. In an alternative embodiment, die pad 2025 can be a patterned metal body. Also, formation of the through holes 201b of the patterned base 201' is optional. The underlying apertures or through holes provide a conductive path downward for the applied package. Such a pattern allows a fan-in type wiring with off-package electrical connections under the die.

Figure 4:
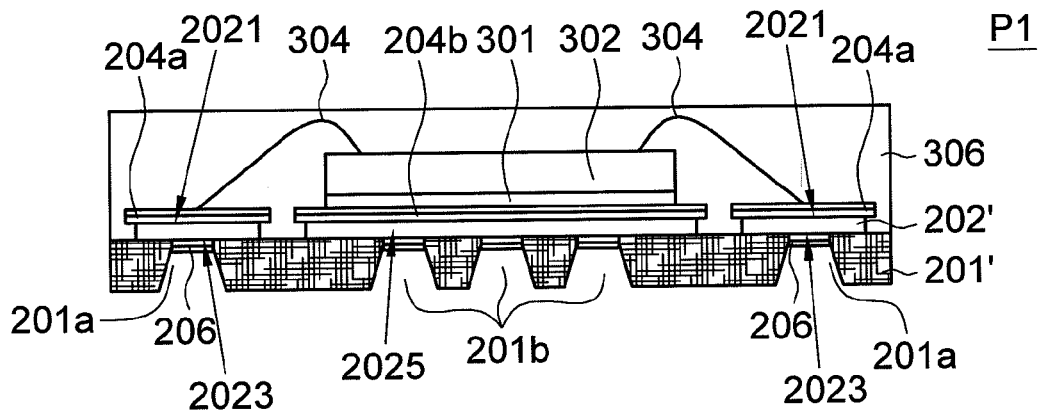
FIG. 4 depicts a package with the substrate of FIG. 3F manufactured according to the first embodiment of the present invention.

Moreover, the substrate S1 of FIG. 3F may further optionally include a second surface finish layer 206 (as shown in FIG. 4) formed on one or more surfaces of the first contact pads 2023 and the lower surface of the die pad 2025 within the through holes 201b, to enhance the electrical connection to an external printed circuit board. In particular embodiment, the first contact pads 2023 could be coated with solder paste, or deposited a conductive material as the second surface finish layer 206. The methods of forming the first surface finish layers 204a and 204b and the second surface finish layer 206 could be the same or different. Also, materials chosen for making the first surface finish layers 204a and 204b and the second surface finish layer 206 could be identical or different. In the present embodiment, materials of the first surface finish layers 204a and 204b and the second surface finish layer 206 are independently selected from the group consisting of Ni/Au, NiPdAu, Ni/Ag, Au, Tin, Tin-lead alloy, silver, OSP and combination thereof. Alternatively, the final surface treatments for contact pads can be done by selective plating of electroless nickel/electroless palladium/immersion gold (ENEPIG) and OSP depending on the requirements of applications. In addition, substrate S1 of FIG. 3F shows that the first contact pads 2023 at the lower surface of the patterned metal layer 202' is juxtaposed with the second contact pads 2021 at the upper surface of the patterned metal layer 202'. However, first contact pads 2023 are not required to be co-located with the second contact pads 2021 as long as they are connected with a metal trace for electrical conduction. It is noted that the second surface finish layer 206 is optional although preferred, and it may be selectively applied depending on application.

FIG. 4 depicts a package with the substrate of FIG. 3F manufactured according to the first embodiment of the present invention. Package P1 includes the substrate S1 as presented in FIG. 3F, a die 302 disposed on the die pad 2025, the bonding wires 304 and a molding compound 306. Lower surface of the die 302 is attached to the first surface finish layer 204b on the die pad 2025 with an adhesive material 301 (such as epoxy). The active surface of the die 302 is electrically connected to the first surface finish layer 204a on the second contact pads 2021 through the bonding wires 304. The die 302 and the patterned metal layer 202' are positioned at the same side of the patterned base 201'. The molding compound 306 is applied onto the patterned base 201' so as to cover the patterned metal layer 202', the die 302, the bonding wires 304, and the upper surface of the patterned base 201' (the lower surface of the patterned base 201' remains bare). The bonding wires 304 may be formed of gold, silver, copper, aluminum, and alloys thereof. The material selected for molding compound 306 should be electrically insulating, such as epoxy. Moreover, parts of the lower surface of the patterned metal layer 202' exposed to form the first contact pads 2023 could be electrically connected to an external printed circuit board (not shown). In particular embodiment, the second surface finish layer 206 could be formed by coating the first contact pads 2023 with solder paste or filling the aperture 201a with conductive material. Also, after separating the package sites of encapsulated array to form individual packages, the side of the molding compound 306 of each package is aligned with the side of the patterned base 201' as shown in FIG. 4. It should be noted that the packages are electrically testable before singulating into individual units because the metal patterns on the patterned metal layer 202' are individual and supported by the patterned base 201'.

Besides substrate S1 depicted in FIG. 3F, the substrate structure could be varied by slightly modifying the methods described above without departing from the spirit of the invention.

Figure 5A:
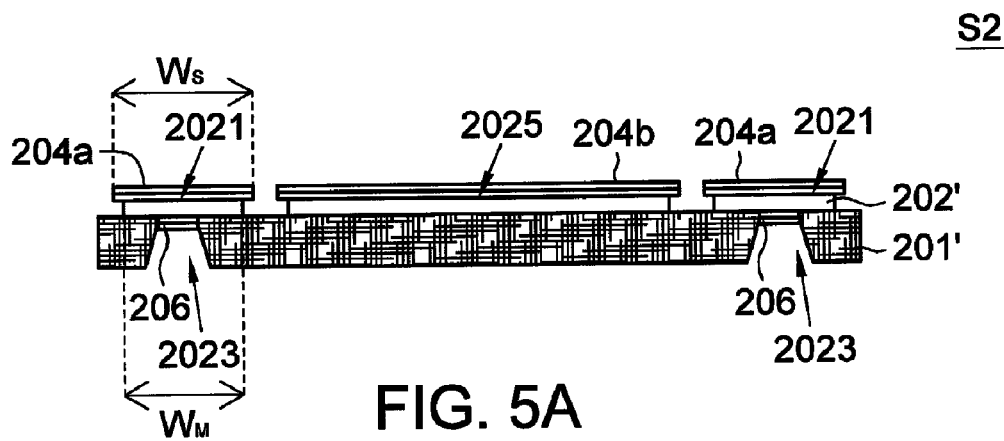
FIG. 5A is a cross-sectional view of an alternative substrate manufactured according to the first embodiment of the present invention.

FIG. 5A is a cross-sectional view of an alternative substrate manufactured according to the first embodiment of the present invention. Substrate S2 of FIG. 5A is similar to substrate S1 of FIG. 3F except the portion of the patterned base 201' associated with the die pad being continuous (i.e. unpatterned). In the process of manufacturing substrate S2 of FIG. 5A, the base 201 is patterned by merely forming the apertures 201a to expose the first contact pads 2023 (i.e. slightly modifying the step of forming the patterned base 201' as shown in FIG. 3B), so that the portion of the patterned base 201' associated with the die pad 2025 is a continuous base body. Also, the first surface finish layers 204a and 204b are respectively formed on the surfaces of the second contact pads 2021 and the die pad 2025. Similarly, the first surface finish layers 204a and 204b of FIG. 5A are wider than the second contact pad 2021 and the die pad 2025, respectively.

Figure 5B:
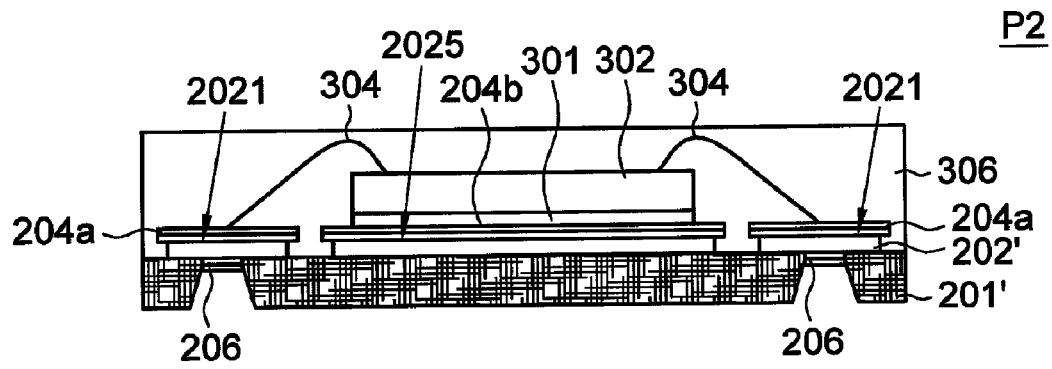
FIG. 5B depicts a package with the substrate of FIG. 5A manufactured according to the first embodiment of the present invention.

FIG. 5B depicts a package with the substrate of FIG. 5A manufactured according to the first embodiment of the present invention. Package P2 includes the substrate S2, a die 302, the bonding wires 304 and a molding compound 306. Lower surface of the die 302 is attached to the first surface finish layer 204b on the die pad 2025 with an adhesive material 301 (such as epoxy). The active surface of the die 302 is electrically connected to the first surface finish layer 204a on the second contact pads 2021 through the bonding wires 304. The molding compound 306 is applied onto the patterned base 201' so as to cover the patterned metal layer 202', the die 302, the bonding wires 304, and the upper surface of the patterned base 201' (the lower surface of the patterned base 201' is bare). Parts of the lower surface of the patterned metal layer 202' exposed to form the first contact pads 2023 could be electrically connected to an external printed circuit board (not shown) through the second surface finish layer 206. Also, after separating the package sites of encapsulated array to form individual packages, the side of the molding compound 306 of each package is aligned with the side of the patterned base 201' as shown in FIG. 5B. It should be noted that the packages are electrically testable before singulating into individual units because the metal patterns on the patterned metal layer 202' are individual and supported by the patterned base 201'.

According to the above descriptions, the substrates S1, S2 as shown in FIG. 3F and FIG. 5A mainly include a patterned metal layer (as conductive traces) and a patterned base. The substrate S1/S2 according to the first embodiment is very thin, having a thickness ranging from about 30 μm to about 130 μm. The package size applied with the substrate of the first embodiment can be effectively kept to a minimum with this combination. This extra thin substrate is particularly suitable for the application of small-sized, low profile products. Also, the method disclosed in the first embodiment not only makes the substrate with smaller trace pitch, but also simplifies the substrate manufacturing process.

Although FIG. 3A~FIG. 3E demonstrate the method of manufacturing the substrate progressing at single side of the carrier, it is not intended to limit the invention to these illustrative sense. The method of manufacturing the substrate can be simultaneously progressed at both sides of the carrier 20 for increasing the production rate.

Second Embodiment

Besides substrates S1 and S2 of the first embodiment, the substrate structure can be varied by slightly modifying the methods described above without departing from the spirit of the invention. The features of the second embodiment identical to the features of the first embodiment are designated with the same reference numbers.

FIG. 6A~FIG. 6F schematically shows a progressive flow of manufacturing a substrate having a single patterned metal layer according to the second embodiment of the present invention. The processes of manufacturing the substrates of the first and second embodiments are similar except for a change in the formation the patterned metal layer and the first surface finish layer. Same features in the drawings of the first and second embodiments are designated with the same reference numbers, and redundant discussion is omitted.

Figure 6A:
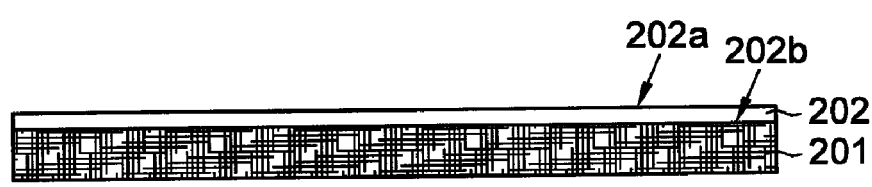
FIG. 6A~FIG. 6F schematically shows a progressive flow of manufacturing a substrate having a single patterned metal layer according to the second embodiment of the present invention.

First, a base 201 is provided, and a metal layer 202 is formed on the base 201, as shown in FIG. 6A. The metal layer 202 includes an upper surface 202a and a lower surface 202b. Please refer to the first embodiment for discussions of the base 201 and the metal layer 202.

Figure 6B:
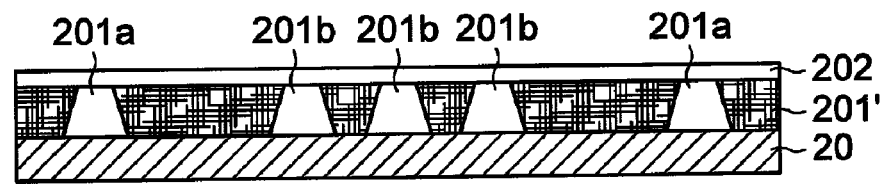

Next, the base 201 is patterned to form a patterned base 201' with a plurality of apertures 201a or through holes 201b, as shown in FIG. 6B. Typically, one or the other type of holes or apertures is used although the Figures show both for convenience. The patterning of the base 201 may be done by conventional stamping, chemical etching, or other computer-aided drilling methods (such as laser drilling or mechanical drilling). In the case of through holes, the metal layer is formed on the base after the patterning of the base. Subsequently, the patterned base 201' is placed on a carrier 20. In particular embodiments (ex: when the base 201 being patterned by laser drilling), an exposed area of the bottom surface of the patterned base 201' by one of the apertures 201a and the through holes 201b is larger than an exposed area of an upper surface of the patterned base 201' by the aperture 201a/through holes 201b. However, method for patterning the base 201 is not limited, and configurations of the apertures 201a/through holes 201b may vary from that illustrated in FIG. 6B, depending on the specific requirements in practical application.

Subsequently, steps of forming the patterned metal layer 202' and the first surface finish layers 205a and 205b proceed. In the second embodiment, the metal layer 202 is patterned before forming the first surface finish layers 205a and 205b.

Figure 6C:
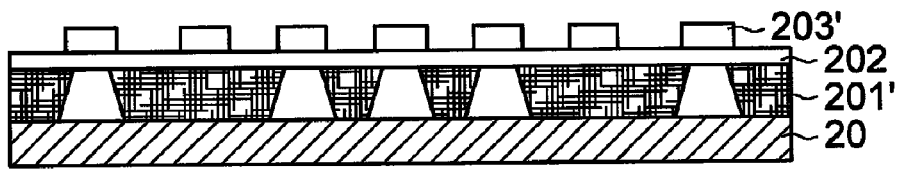
Figure 6D:
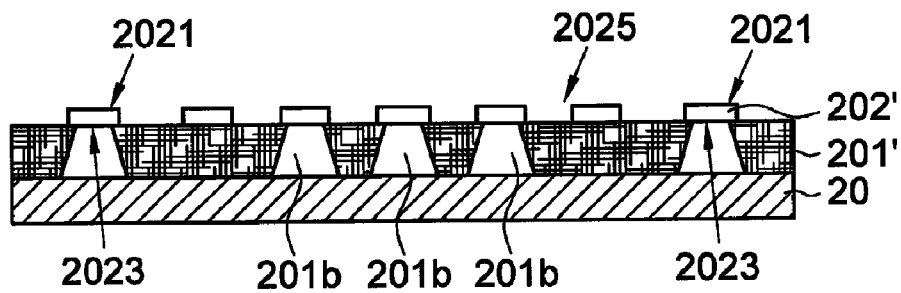

A patterned photo-resist 203' is formed on the metal layer 202, as shown in FIG. 6C. Then, the metal layer 202 is etched according to the patterned photo-resist 203' (as a mask) to form a patterned metal layer 202', as shown in FIG. 6D. Finally, the patterned photo-resist 203' is removed. The patterned metal layer 202' ultimately will form the first contact pads 2023, the second contact pads 2021 and the die pad 2025, wherein the die pad 2025 has several holes 202c. Also, the first and second contact pads 2023 and 2021 are positioned outside the die pad 2025. The first and second contact pads 2023 and 2021 and in the same horizontal plane as die pad 2025.

Figure 6E:
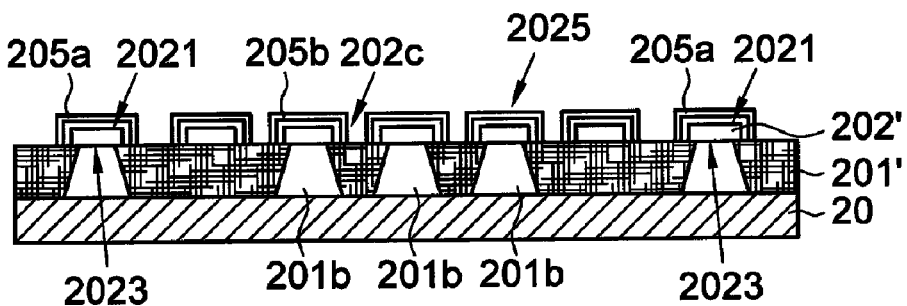

Subsequently, a first surface finish layer 205a is formed on one or more surfaces and sidewalls of the second contact pads 2021 (i.e. the first surface finish layer 205a covers the second contact pads 2021), as shown in FIG. 6E. Thus, the first surface finish layer 205a (i.e. the top surface of the first surface finish layer 205a) is wider than the second contact pad 2021 beneath. Also, a first surface finish layer 205b could be optionally formed on the surface and sidewalls of the die pad 2025.

Figure 6F:
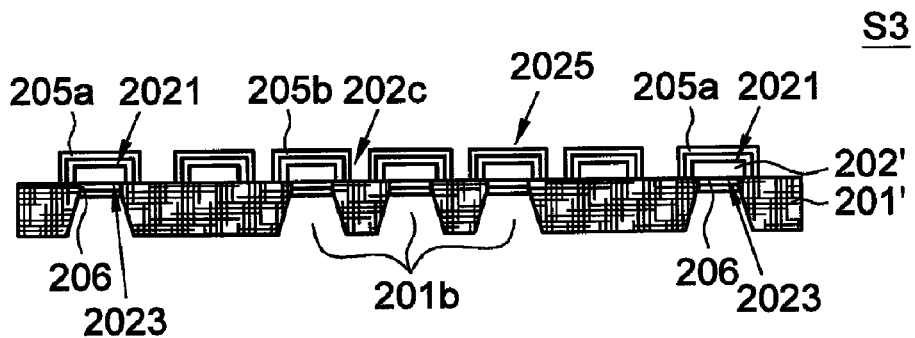

Finally, the carrier 20 is removed to complete the fabrication of the substrate S3, as shown in FIG. 6F. OSP or some other surface finish (such as second surface finish layer 206) will be applied on the first contact pads 2023 to ensure their solderability (as shown in FIG. 6F or FIG. 7A).

FIG. 6F is cross-sectional view of a substrate according to the second embodiment of the present invention. In the substrate S3 of FIG. 6F, parts of the lower surface of the patterned metal layer 202' are exposed by the apertures 201a of the patterned base 201' to form the first contact pads 2023 for electrical connection externally. In particular applications, the first contact pads 2023 are ball pads for being attached by the solder balls (not shown) downwardly. In one embodiment, the patterned base 201' may include at least an open slot so as to expose the first contact pads 2023. Also, parts of the upper surface of the patterned metal layer 202' function as a plurality of second contact pads 2021 for electrical connection upwardly. In typical applications, the second contact pads 2021 are the bonding pads for conductive connection between the substrate S3 and a die/chip (not shown) of the package. In addition, the die pad 2025 as illustrated in FIG. 6F is a patterned metal body (having the holes 202c), and the portion of the patterned base 201' juxtaposed with the die pad 2025 is a patterned base body (i.e. the lower surface of die pad 2025 being exposed by the through holes 201b of the patterned base 201'), which enhances thermal performance and provide a conductive path for the applied package.

Figure 7A:
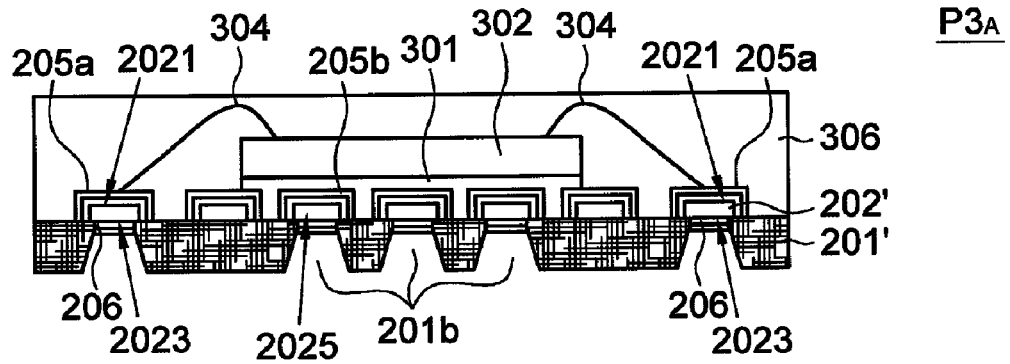
FIG. 7A depicts a wire-bonding type package with the substrate of FIG. 6F manufactured according to the second embodiment of the present invention.

Moreover, the substrate S3 further includes a second surface finish layer 206 (as shown in FIG. 6E and FIG. 7A) formed on one or more surfaces of the first contact pads 2023 and the lower surface of the die pad 2025 within the through holes 201b optionally, to enhance the electrical connection to an external printed circuit board. In particular embodiment, the first contact pads 2023 could be coated with solder paste, or deposited a conductive material as the second surface finish layer 206. The methods of forming the first surface finish layers 205a~205b and the second surface finish layer 206 could be the same or different. Also, materials chosen for making the first surface finish layers 205a, 205b and the second surface finish layer 206 could be identical or different. In the present embodiment, materials of the first surface finish layers 205a, 205b and the second surface finish layer 206 are independently selected from the group consisting of Ni/Au, Ni/Pd/Au, Ni/Ag, Au, Tin, Tin-lead alloy, silver, OSP, and combination thereof. Alternatively, the final surface treatments for contact pads can be done by selective plating of electroless nickel/electroless palladium/immersion gold (ENEPIG) and OSP, depending on the requirements of applications.

Please refer to the substrates S1 and S2, and substrate S3 depicted in FIG. 3F, FIG. 5A and FIG. 6F of the first and second embodiments, respectively. In the first embodiment, the first surface finish layers 204, 204a and 204b are formed on the surfaces of the second contact pads 2021 and the die pad 2025. In the second embodiment, the first surface finish layers 205a and 205b cover (being formed on the surfaces and sidewalls of) the second contact pads 2021 and the die pad 2025. Also, the substrate S3 depicted in FIG. 6F of the second embodiments includes a patterned metal layer 202' with a patterned metal body functioned as the die pad 2025, and the patterned base 201' with a patterned base body beneath the die pad 2025. However, other variations are possible, depending on the requirements of practical applications. For example, the die pad 2025 could be a continuous metal body while the patterned base 201' includes a patterned base body, as depicted in FIG. 3F of the first embodiment. Alternatively, the die pad 2025 could be a continuous metal body and the patterned base 201' includes a continuous base body, as depicted in FIG. 5A of the first embodiment.

The substrates presented above could be applied to a wire-bonding type package or a flip-chip type package, and could be slightly modified to a pattern allows a fan-in type or fan-out type with package electrical connections. FIG. 7A depicts a wire-bonding type package with the substrate of FIG. 6F manufactured according to the second embodiment of the present invention. Package $P3_A$ includes the substrate S3 of FIG. 6F, a die 302 wire bonded to the substrate, the bonding wires 304 and a molding compound 306. Lower surface of the die 302 is attached to the first surface finish layer 205b on the die pad 2025 with an adhesive material 301 (such as epoxy). The active surface of the die 302 is electrically connected to the first surface finish layer 205a on the second contact pads 2021 through the bonding wires 304. The molding compound 306 is applied onto the patterned base 201' so as to cover the patterned metal layer 202' (including the surface finish 205a), the die 302, the bonding wires 304 and the upper surface of the patterned base 201' (the lower surface of the patterned base 201' is bare). Parts of the lower surface of the patterned metal layer 202' exposed to form the first contact pads 2023 could be electrically connected to an external printed circuit board (not shown) through the second surface finish layer 206. It is noted that the second surface finish layer 206 is optional although preferred, and it may be selectively applied depending on application. Also, after separating the package sites of encapsulated array to form individual packages, the side of the molding compound 306 of each package is aligned with the side of the patterned base 201' as shown in FIG. 7A. Further, formation of the through holes 201b of the patterned base 201' is optional. As shown in FIG. 7A, the upper electrical connection of the die 302 disposed on the die pad 2025 connects to the ball pads (i.e. the second surface finish layer 206 at the first contact pads 2023) outside the die, and such a pattern allows a fan-out type wiring package application.

Figure 7B:
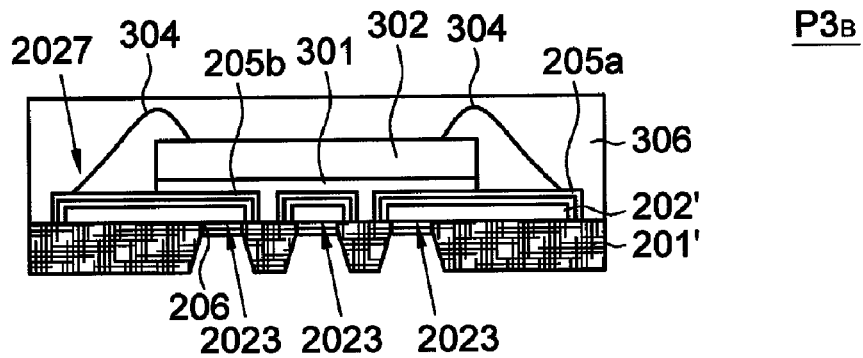
FIG. 7B depicts another wire-bonding type package with a modified substrate of FIG. 6F manufactured based on the method of the second embodiment of the present invention.

Besides substrate S3 depicted in FIG. 6F, the substrate structure could be varied without departing from the spirit of the invention, such as slightly modifying the pattern of metal layer. FIG. 7B depicts another wire-bonding type package $P3_B$ with a modified substrate of FIG. 6F manufactured based on the method of the second embodiment of the present invention. As shown in FIG. 7B, the die 302 is disposed on the second contact pads 2027, and the active surface of the die 302 is wire bonded to the first surface finish layer 205a on the second contact pads 2027 through the bonding wires 304. Also, the second surface finish layer 206 is formed on the lower surface of the patterned metal layer 202' beneath the die 302 to ensure their solderability, so that the die 302 is electrically connected to an external printed circuit board (not shown) through the surface finish layer 206. Thus, the upper electrical connection of the die 302 disposed on the second contact pads 2027 connects to the ball pads (i.e. the second surface finish layer 206 in the apertures 201b) under the die 302, and such a pattern allows a fan-in type wiring with off-package electrical connections under the die. Similarly, the second surface finish layer 206 is optional although preferred, and it may be selectively applied depending on application.

Figure 7C:
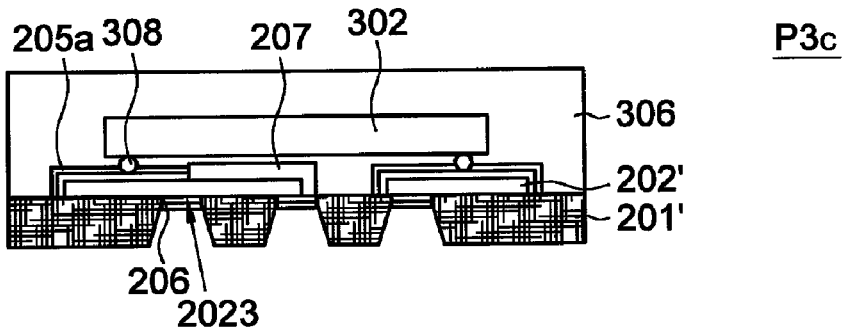
FIG. 7C depicts a flip-chip type package with another modified substrate of FIG. 6F manufactured based on the method of the second embodiment of the present invention.

FIG. 7C depicts a flip-chip type package with another modified substrate of FIG. 6F manufactured based on the method of the second embodiment of the present invention. As shown in FIG. 7C, package $P3_C$ includes the patterned base 201', the patterned metal layer 202' (the die pad also functioned as the die bonding pads), the die 302, the solder balls 308 and the molding compound 306. The die 302 of the package $P3_C$ is flipped bonded to the patterned metal layer 202' through the solder balls 308, gold bumps, copper pillar, or any flip chip connection ways. The upper surfaces of the second contact pads 2027 could be optionally covered by the first surface finish layers 205a or the solder mask 207. In application, the first surface finish layer 205a is applied selectively to control the size of flip chip interconnection. It is understood that the first surface finish layers 205a and the solder mask 207 are alternatively selected in application although FIG. 7C show both for convenience. Also, the first contact pads 2023 within the die shadow expose parts of the lower surface of the patterned metal layer 202', and the second surface finish layer 206 is optionally formed on the lower surface of the patterned metal layer 202' for providing a downward conductive path between the package $P3_C$ and an external printed circuit board (not shown). Thus, the electrical connection of the die 302 disposed on the second contact pads 2027 connects to the ball pads (i.e. the second surface finish layer 206 at the first contact pads 2023) substantially under the die region (ex: under the die shadow), and such a pattern allows a fan-in type wiring with off-package electrical connections under the die.

Figure 7D:
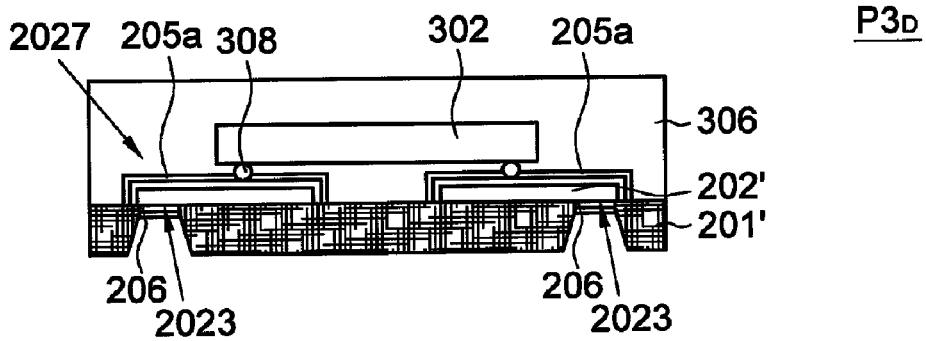
FIG. 7D depicts another flip-chip type package with modified substrate of FIG. 6F manufactured based on the method of the second embodiment of the present invention.

FIG. 7D depicts another flip-chip type package with modified substrate of FIG. 6F manufactured based on the method of the second embodiment of the present invention. As shown in FIG. 7D, package $P3_D$ includes the patterned base 201', the patterned metal layer 202' (the die pad also functioned as the die bonding pads), the die 302, the solder balls 308 and the molding compound 306. The die 302 of the package $P3_D$ is flipped bonded to the patterned metal layer 202' through the solder balls 308, gold bumps, copper pillar, or any flip chip connection ways. The upper surfaces of the second contact pads 2027 could be optionally covered by the first surface finish layers 205a. The first contact pads 2023 outside the die shadow expose parts of the lower surface of the patterned metal layer 202', which provides a downward conductive path between the package P3$_D$ and an external printed circuit board (not shown). It is noted that the second surface finish layer 206 is optionally (although preferably) formed at the first contact pads 2023, and it may be selectively applied depending on application. Further, the first surface finish layer 205a is applied selectively to control the size of flip chip interconnection in application. In FIG. 7D, the electrical connection of the die 302 disposed on the first surface finish layers 205a of the second contact pads 2027 connects to the ball pads (i.e. the second surface finish layer 206 at the first contact pads 2023) substantially outside the die region (ex: outside the die shadow), and such a pattern allows a fan-out type wiring package application. Furthermore, the flip chip package could be optionally made with underfill and overmold, although packages of FIG. 7C and FIG. 7D merely show the molding compound 306 for simplicity.

According to the above descriptions, the substrate, such as the substrate S3 as shown in FIG. 6F, the modified substrate structure of FIG. 7B-FIG. 7D, mainly includes a patterned metal layer (as conductive traces) and a patterned base. The substrate S3 according to the second embodiment is very thin, having a thickness ranged from about 30 μm to about 130 μm. The package size applied with the substrate of the second embodiment can be effectively kept to a minimum with this combination. This extra thin substrate is particularly suitable for the application of small-sized product. Also, the method disclosed in the second embodiment not only makes the substrate with smaller trace pitch, but also simplifies the substrate manufacturing process.

Third Embodiment

The methods disclosed in the first and second embodiments adopt the substrates with the base 201 formed of resin material. In the third embodiment, the base 201 formed of dielectric material is exemplified for describing the progressive flow of manufacturing the substrate. Also, a carrier is adopted in the third embodiment during substrate fabrication.

FIG. 8A~FIG. 8F schematically shows a progressive flow of manufacturing a substrate having a single patterned metal layer according to the third embodiment of the present invention.

Figure 8A:
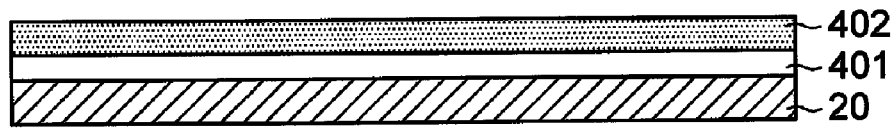
FIG. 8A~FIG. 8F schematically shows a progressive flow of manufacturing a substrate having a single patterned metal layer according to the third embodiment of the present invention.

First, a carrier 20 is provided. A metal layer 401 is formed on the carrier 20, and a base 402 is formed on the metal layer 401, as shown in FIG. 8A. The base 402 may be formed of solder mask (SM), liquid crystal polymer (LCP), prepreg (PP), or other dielectric materials.

Figure 8B:
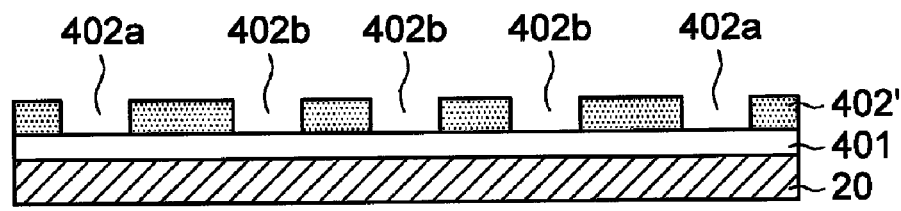

Next, the base 402 is patterned to form a patterned base 402' with a plurality of apertures 402a and through holes 402b, as shown in FIG. 8B. The patterning of the base 402 may be done by computer-aided drilling methods (such as laser drilling or mechanical drilling), conventional stamping, or chemical etching.

Figure 8C:
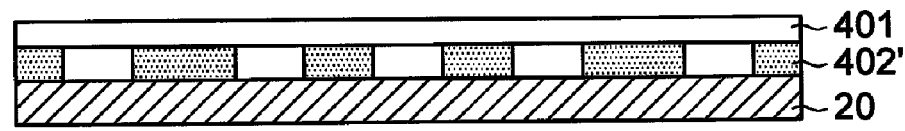

Subsequently, the metal layer 401 and the patterned base 402' are removed from the carrier, and re-placed invertedly on the carrier 20, as shown in FIG. 8C.

Figure 8D:
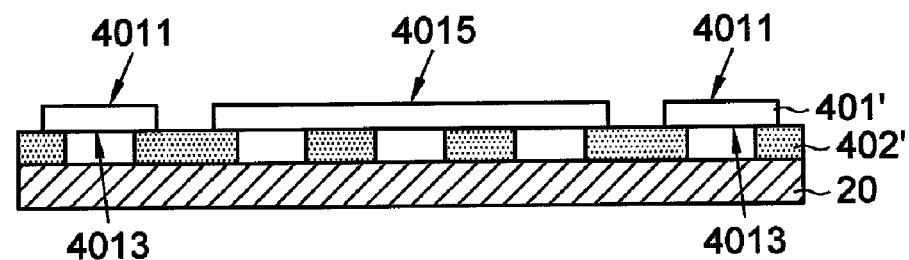

A patterned dry film (not shown) is formed on the metal layer 401, and the metal layer 401 is etched according to the patterned dry film (as a mask) to form a patterned metal layer 401', as shown in FIG. 8D. The patterned metal layer 401' ultimately will form the first contact pads 4013, the second contact pads 4011 and the die pad 4015. The first and second contact pads 4013 and 4011 are positioned outside the die pad 4015. Also, the first and second contact pads 4013 and 4011 and in the same horizontal plane as die pad 4015.

Figure 8E:
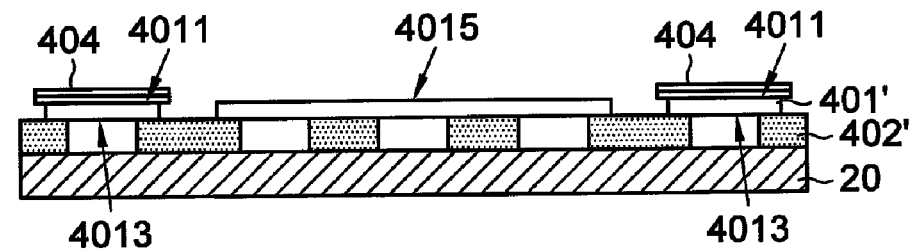

Afterward, a first surface finish layer 404 is formed on one or more surfaces of the second contact pads 4011, as shown in FIG. 8E. The first surface finish layer 404 is wider than the second contact pad 4011 beneath.

Figure 8F:
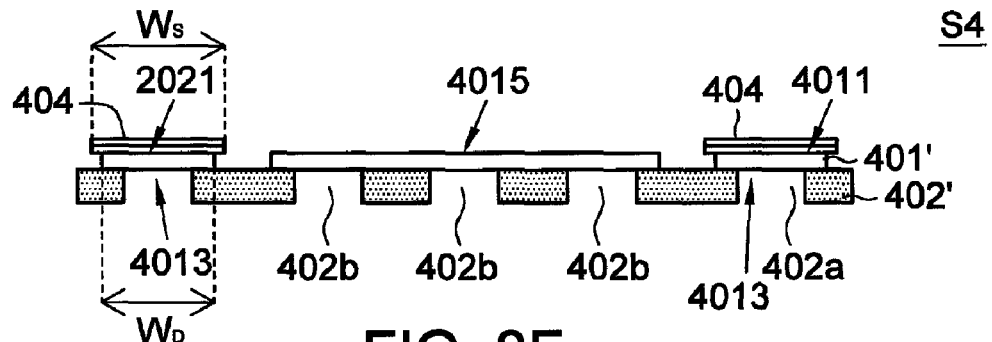

Finally, the carrier 20 is removed to complete the fabrication of the substrate S4, as shown in FIG. 8F.

FIG. 8F is cross-sectional view of a substrate according to the third embodiment of the present invention. In the substrate S4 of FIG. 8F, parts of the lower surface of the patterned metal layer 401' are exposed by the apertures 402a of the patterned base 402' to form the first contact pads 4013 for electrical connection at the lower side of the substrate. In particular applications, the first contact pads 4013 are ball pads for being attached by the solder balls (not shown) downwardly. In one embodiment, the patterned base 402' may include at least an open slot so as to expose the first contact pads 4013. Also, parts of the upper surface of the patterned metal layer 401' function as a plurality of second contact pads 4011 for electrical connection upwardly. In typical applications, the second contact pads 4011 are the bonding pads for conductive connection between the substrate S4 and a die/chip (not shown) of the package. In the third embodiment, the first surface finish layer 404 is formed on the surfaces of the second contact pads 4011, and the width $W_S$ of the first surface finish layer 404 is larger than the width $W_M$ of the second contact pad 4011 beneath as well as the width of the first contact pads 4013.

Figure 9:
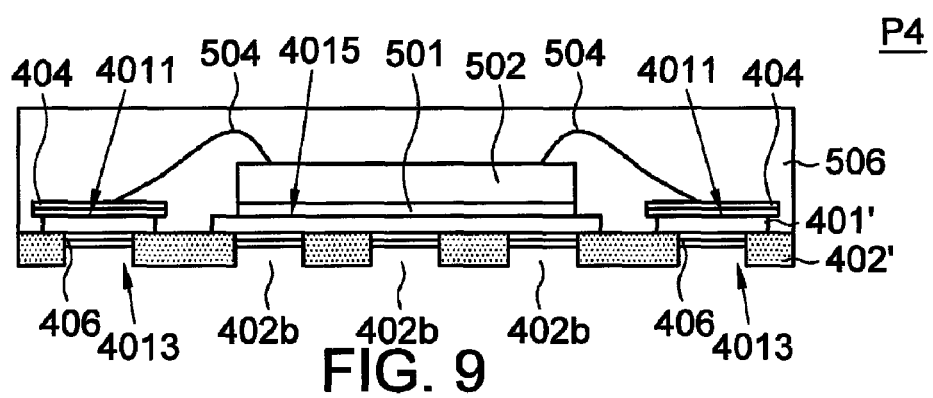
FIG. 9 depicts a package with the substrate of FIG. 8F manufactured according to the third embodiment of the present invention.

FIG. 9 depicts a package with the substrate of FIG. 8F manufactured according to the third embodiment of the present invention. Package P4 includes the substrate S4, a die 502 disposed on the die pad 4015, the bonding wires 504 and a molding compound 506. Lower surface of the die 502 is attached to the die pad 4015 with an adhesive material 501 (such as epoxy). The active surface of the die 502 is electrically connected to the first surface finish layer 404 on the second contact pads 4011 through the bonding wires 504. The die 502 and the patterned metal layer 401' are positioned at the same side of the patterned base 402'. The molding compound 506 is applied onto the patterned base 402' so as to cover the patterned metal layer 401', the die 502, the bonding wires 504, and the upper surface of the patterned base 402' (the lower surface of the patterned base 402' is bare). Moreover, parts of the lower surface of the patterned metal layer 401' exposed to form the first contact pads 4013 could be electrically connected to an external printed circuit board (not shown). In a particular embodiment, a second surface finish layer 406 could be formed on the first contact pads 4013 for electrically connection to an external printed circuit board (not shown), and also formed at the lower surface of the die pad 4015 within the through holes 402b. Also, after separating the package sites of encapsulated array to form individual packages, the side of the molding compound 506 of each package is aligned with the side of the patterned base 402' as shown in FIG. 9. Moreover, materials of the first surface finish layer 404 and the second surface finish layer 406 are independently selected from the group consisting of Ni/Au, Ni/Pd/Au, Ni/Ag, Au, Tin, Tin-lead alloy, silver, OSP, and combination thereof. Alternatively, the final surface treatments for contact pads can be done by selective plating of electroless nickel/electroless palladium/immersion gold (ENEPIG) and OSP, depending on the requirements of applications.

Except the material selections of the bases 402 and 201, substrates S1 and S4 respectively shown in FIG. 8F and FIG. 3F of the third and first embodiments have common features, such as a patterned base body beneath the die pad being formed to expose parts of the bottom surface of the die pad, and the first surface finish layer formed on the surfaces of the second contact pads.

Besides substrate S4 depicted in FIG. 8F, the substrate structure could be slightly changed by modifying the methods described above without departing from the spirit of the invention.

Figure 10A:
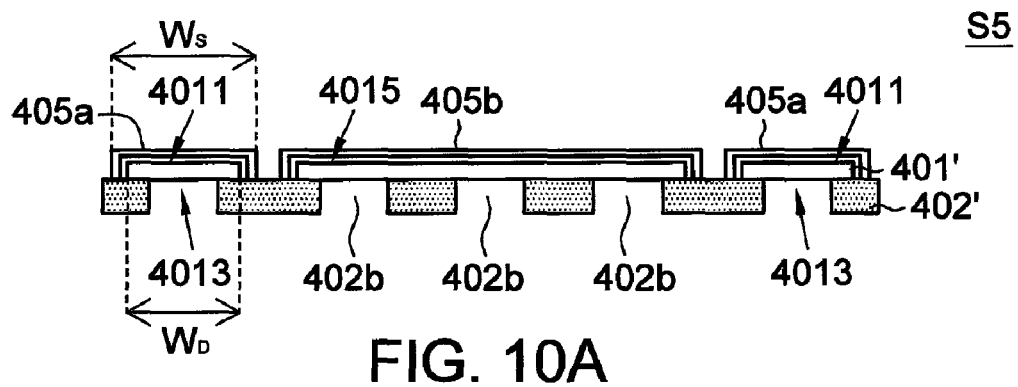
FIG. 10A is cross-sectional view of an alternative substrate manufactured according to the third embodiment of the present invention.

FIG. 10A is cross-sectional view of an alternative substrate manufactured according to the third embodiment of the present invention. Substrate S5 of FIG. 10A is similar to substrate S4 of FIG. 8F except the forming position and configuration of the first surface finish layer. In FIG. 10A, the first surface finish layers 405a and 405b are respectively formed on the surfaces and sidewalls of the second contact pads 4011 and the die pad 4015 (i.e. achieved by slightly modifying the step of forming the first surface finish layer 404 as shown in FIG. 8E). Similarly, the first surface finish layers 405a and 405b of FIG. 10A are wider than the second contact pad 4011 and the die pad 4015, respectively.

Figure 10B:
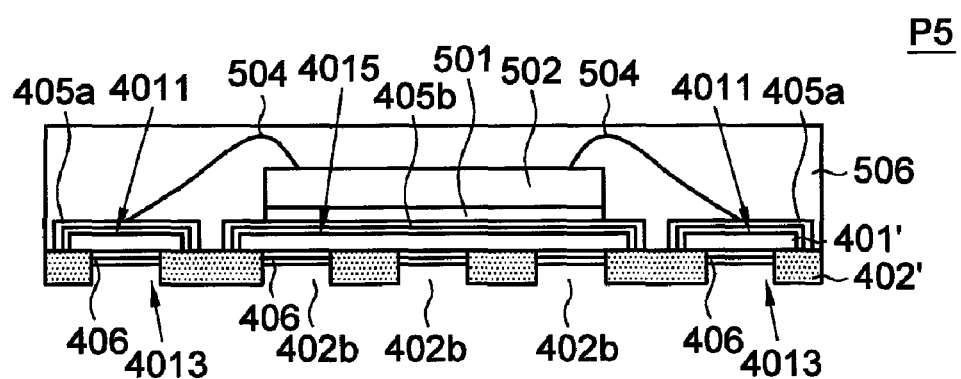
FIG. 10B depicts a package with the substrate of FIG. 10A manufactured according to the third embodiment of the present invention.

FIG. 10B depicts a package with the substrate of FIG. 10A manufactured according to the third embodiment of the present invention. Package P5 the substrate S5, a die 502, the bonding wires 504 and a molding compound 506. Lower surface of the die 502 is attached to the first surface finish layers 405b on the die pad 4015 with an adhesive material 501 (such as epoxy). The active surface of the die 502 is electrically connected to the first surface finish layer 405a on the second contact pads 4011 through the bonding wires 504. The die 502 and the patterned metal layer 401' are positioned at the same side of the patterned base 402'. The molding compound 506 is applied onto the patterned base 402' so as to cover the patterned metal layer 401', the die 502, the bonding wires 504, and the upper surface of the patterned base 402' (the lower surface of the patterned base 402' is bare). Moreover, parts of the lower surface of the patterned metal layer 401' exposed to form the first contact pads 4013 could be electrically connected to an external printed circuit board (not shown). In particular embodiment, a second surface finish layer 406 could be formed on the first contact pads 4013 electrically connects to an external printed circuit board (not shown), and also formed at the lower surface of the die pad 4015 within the through holes 402b. The underlying through holes 402b provides a conductive path downward for the applied package. Also, after separating the package sites of encapsulated array to form individual packages, the side of the molding compound 506 of each package is aligned with the side of the patterned base 402' as shown in FIG. 10B.

Although FIG. 8F and FIG. 10B depicts the die pads 4015 of substrates S4 and S5 as a continuous metal body on the patterned base 402', it is not intended that the invention be limited to this illustrative embodiment. In an alternative embodiment, die pad 4015 can be a patterned metal body having several openings associated with the through holes 402b of the patterned base 402', which may provide a conductive path for applied package.

According to the above descriptions, the substrates S4, S5 as shown in FIG. 8F and FIG. 10A merely include a patterned metal layer (as conductive traces) and a patterned base. The substrate S4/S5 according to the third embodiment is very thin, having a thickness ranged from about 30 μm to about 130 μm. The package size applied with the substrate of the third embodiment can be effectively kept to a minimum with this combination. This extra thin substrate is particularly suitable for the application of small-sized product. Also, the method disclosed in the third embodiment not only makes the substrate with smaller trace pitch, but also simplifies the substrate manufacturing process.

Although several types of substrates (S1-S5) and packages (P1-P2) have been illustrated with reference to specific embodiments, it is noted that the final structure of the substrate can be variable in accordance with requirements of the practical application. For example, materials and patterns of the base and metal layer would be varied from the illustration, depending to the specific requirements of the device. Also, the die could be wire bonded or flipped bonded to the substrate. Those skilled in the art will recognize that modifications and variations can be made without departing from the spirit of the invention.

The foregoing description and illustrations contained herein demonstrate many of the advantages associated with the present invention over the prior art. By providing substrate having two layers (patterned base and patterned metal layer), the thickness of the substrate is reduced to about 30 μm-130 μm giving rise to a lower profile package. This extra thin substrate is particularly suitable for the application of small-sized product. Also, the methods for manufacturing the substrates and packages disclosed in the foregoing embodiments are simple and suitable for mass production which has advantages of low cost and high yield of production. Compared to the prior art, the substrate structure of the disclosure satisfies the desired requirements of the electronic product with thin profile and low cost. Thus, the electronic product applied with the substrate of the present invention, especially for the small-sized and low-priced product, is very competitive in the commercial market.

While the invention has been described by way of example and in terms of the preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package, comprising:
    a patterned base, having a plurality of apertures, and comprising a glass fiber reinforced material;
    a patterned metal layer, disposed on the patterned base, the patterned metal layer having an upper surface and a lower surface, wherein parts of the lower surface of the patterned metal layer are exposed by the apertures of the patterned base to form a plurality of lower contact pads for electrical connection externally, and parts of the upper surface of the patterned metal layer correspond to a plurality of upper contact pads and to a die pad which is a continuous metal body;
    a first conductive, surface finish layer, disposed on the upper contact pads, wherein a portion of the first conductive, surface finish layer is wider than the upper contact pad beneath the portion of the first conductive, surface finish layer, and another portion of the first conductive, surface finish layer is disposed on the die pad, and is wider than the die pad;
    a semiconductor device, disposed over the patterned metal layer and electrically connected to the first conductive, surface finish layer; and
    a molding compound encapsulating the semiconductor device.

2. The semiconductor package according to claim 1, wherein the first conductive, surface finish layer is disposed on sidewalls of the upper contact pads.

3. The semiconductor package according to claim 1, further comprising a second conductive, surface finish layer covering the lower contact pads.

4. The semiconductor package according to claim 3, wherein materials of the first and second surface finish layers are independently selected from metals and metal alloys.

5. The semiconductor package according to claim 1, wherein at least one of the lower contact pads is disposed outside a periphery of the semiconductor device.

6. The semiconductor package according to claim 1, wherein at least one of the apertures of the patterned base has a tapered sidewall.

7. The semiconductor package according to claim 1, wherein at least one of the upper contact pads is substantially co-located with a correspondence one of the lower contact pads.

8. The semiconductor package according to claim 1, wherein the patterned metal layer is fully within a periphery of the patterned base.

9. A semiconductor package, comprising:
a substrate, comprising
a patterned base having a plurality of apertures,
a single patterned metal layer disposed on the patterned base, and
a first surface finish layer disposed on the patterned metal layer, the patterned metal layer having an upper surface and a lower surface, wherein parts of the lower surface of the patterned metal layer are exposed by the apertures of the patterned base to form a plurality of lower contact pads for electrical connection externally, parts of the upper surface of the patterned metal layer correspond to a plurality of upper contact pads for electrical connection internally, and at least one of the upper contact pads directly overlies at least a portion of a corresponding one of the lower contact pads, and wherein the first surface finish layer is disposed on sidewalls of the upper contact pads;
a semiconductor device electrically connected to the upper contact pads; and
a molding compound, disposed on the substrate so as to cover the semiconductor device.

10. The semiconductor package according to claim 9, wherein the patterned metal layer comprises at least a die pad on which the semiconductor device is mounted, and the die pad is configured as a continuous metal body.

11. The semiconductor package according to claim 10, wherein a portion of the first surface finish layer is disposed on the die pad, and is wider than the die pad beneath the portion of the first surface finish layer.

12. The semiconductor package according to claim 9, wherein a portion of the first surface finish layer is disposed on one of the upper contact pads, and is wider than the upper contact pad beneath the portion of the first surface finish layer.

13. The semiconductor package according to claim 9, wherein the first surface finish layer is electrically conductive.

14. The semiconductor package according to claim 9, wherein the patterned base comprises a glass fiber reinforced material.

15. The semiconductor package according to claim 9, wherein at least one of the apertures of the patterned base has a tapered sidewall.

16. The semiconductor package according to claim 9, wherein the patterned base comprises a prepreg (PP).

17. The semiconductor package according to claim 9, wherein the substrate has a thickness ranged from about 30 µm to about 130 µm.

18. The semiconductor package according to claim 9, further comprising a plurality of bonding wires electrically connecting an active surface of the semiconductor device to the upper contact pads.

19. The semiconductor package according to claim 18, wherein a material of the bonding wires is selected from the group consisting of gold, silver, copper, aluminum, and alloys thereof.

20. The semiconductor package according to claim 9, wherein an active surface of the semiconductor device faces the upper contact pads.

21. The semiconductor package according to claim 9, wherein a side surface of the molding compound is aligned with a side surface of the patterned base.

22. The semiconductor package according to claim 9, wherein at least one of the lower contact pads is disposed outside a periphery of the semiconductor device.

23. The semiconductor package according to claim 9, further comprising a second surface finish layer covering the lower contact pads.

24. A semiconductor package, comprising:
a patterned base, having a plurality of apertures, and comprising a glass fiber reinforced material;
a patterned metal layer, disposed on the patterned base, the patterned metal layer having an upper surface and a lower surface, wherein parts of the lower surface of the patterned metal layer are exposed by the apertures of the patterned base to form a plurality of lower contact pads for electrical connection externally, and parts of the upper surface of the patterned metal layer correspond to a plurality of upper contact pads;
a first conductive, surface finish layer, disposed on the upper contact pads including on sidewalls of the upper contact pads, wherein a portion of the first conductive, surface finish layer is wider than the upper contact pad beneath the portion of the first conductive, surface finish layer;
a semiconductor device, disposed over the patterned metal layer and electrically connected to the first conductive, surface finish layer; and
a molding compound encapsulating the semiconductor device.

25. The semiconductor package according to claim 24, wherein the patterned metal layer comprises a die pad, which is a continuous metal body.

26. The semiconductor package according to claim 25, wherein portion of the first conductive, surface finish layer is disposed on the die pad, and is wider than the die pad.

27. The semiconductor package according to claim 24, further comprising a second conductive, surface finish layer covering the lower contact pads.

28. The semiconductor package according to claim 27, wherein materials of the first and second surface finish layers are independently selected from metals and metal alloys.

29. The semiconductor package according to claim 24, wherein at least one of the lower contact pads is disposed outside a periphery of the semiconductor device.

30. The semiconductor package according to claim 24, wherein at least one of the apertures of the patterned base has a tapered sidewall.

31. The semiconductor package according to claim 24, wherein at least one of the upper contact pads is substantially co-located with a correspondence one of the lower contact pads.

32. The semiconductor package according to claim 24, wherein the patterned metal layer is fully within a periphery of the patterned base.

33. A semiconductor package, comprising:
a substrate, comprising
- a patterned base having a plurality of apertures,
- a single patterned metal layer disposed on the patterned base, and
- a first surface finish layer disposed on the patterned metal layer, the patterned metal layer having an upper surface and a lower surface, wherein parts of the lower surface of the patterned metal layer are exposed by the apertures of the patterned base to form a plurality of lower contact pads for electrical connection externally, parts of the upper surface of the patterned metal layer correspond to a plurality of upper contact pads for electrical connection internally, and at least one of the upper contact pads directly overlies at least a portion of a corresponding one of the lower contact pads;

a semiconductor device electrically connected to the upper contact pads, wherein the patterned metal layer comprises at least a die pad on which the semiconductor device is mounted, and the die pad is configured as a continuous metal body, and wherein a portion of the first surface finish layer is disposed on the die pad, and is wider than the die pad beneath the portion of the first surface finish layer; and a molding compound, disposed on the substrate so as to cover the semiconductor device.

34. The semiconductor package according to claim 33, wherein a portion of the first surface finish layer is disposed on one of the upper contact pads, and is wider than the upper contact pad beneath the portion of the first surface finish layer.

35. The semiconductor package according to claim 33, wherein the first surface finish layer is disposed on sidewalls of the upper contact pads.

36. The semiconductor package according to claim 33, wherein at least one of the apertures of the patterned base has a tapered sidewall.

37. The semiconductor package according to claim 33, wherein the patterned base comprises a prepreg (PP).

38. The semiconductor package according to claim 33, wherein the substrate has a thickness ranged from about 30 μm to about 130 μm.

39. The semiconductor package according to claim 33, wherein an active surface of the semiconductor device faces the upper contact pads.

40. The semiconductor package according to claim 33, further comprising a second surface finish layer covering the lower contact pads.

* * * * *